(12) United States Patent
Endo et al.

(10) Patent No.: US 11,694,881 B2
(45) Date of Patent: *Jul. 4, 2023

(54) STAGE AND PLASMA PROCESSING APPARATUS

(71) Applicant: TOKYO ELECTRON LIMITED, Tokyo (JP)

(72) Inventors: Hiroki Endo, Miyagi (JP); Katsuyuki Koizumi, Miyagi (JP); Naohiko Okunishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/127,607

(22) Filed: Dec. 18, 2020

(65) Prior Publication Data

US 2021/0104386 A1 Apr. 8, 2021

Related U.S. Application Data

(63) Continuation of application No. 15/989,518, filed on May 25, 2018, now Pat. No. 10,886,109.

(30) Foreign Application Priority Data

May 30, 2017 (JP) .................. 2017-106736

(51) Int. Cl.
*H01L 21/683* (2006.01)
*H01L 21/67* (2006.01)
*H01J 37/32* (2006.01)

(52) U.S. Cl.
CPC .. *H01J 37/32724* (2013.01); *H01J 37/32697* (2013.01); *H01L 21/67103* (2013.01);
(Continued)

(58) Field of Classification Search
CPC .......... H01J 37/32724; H01J 37/32697; H01J 2237/2001; H01L 21/6831;
(Continued)

(56) References Cited

U.S. PATENT DOCUMENTS 10,886,109 B2 * 1/2021 Endo ................. H01L 21/67103
2012/0031889 A1 2/2012 Komatsu
(Continued)

FOREIGN PATENT DOCUMENTS

JP 2014-112672 A 6/2014
JP 2016-006875 A 1/2016
(Continued)

*Primary Examiner* — Laura Edwards
(74) *Attorney, Agent, or Firm* — Weihrouch IP

(57) ABSTRACT

A stage according to an exemplary embodiment has an electrostatic chuck. The electrostatic chuck has a base and a chuck main body. The chuck main body is provided on the base and configured to hold a substrate with electrostatic attractive force. The chuck main body has a plurality of first heaters and a plurality of second heaters. The number of second heaters is larger than the number of first heaters. The first heater controller drives the plurality of first heaters by an alternating current output or a direct current output from a first power source. The second heater controller drives the plurality of second heaters by an alternating current output or a direct current output from a second power source which has electric power lower than electric power of the output from the first power source.

22 Claims, 8 Drawing Sheets

(52) U.S. Cl.
CPC .... *H01L 21/67248* (2013.01); *H01L 21/6831* (2013.01); *H01L 21/6833* (2013.01); *H01J 2237/2001* (2013.01)

(58) Field of Classification Search
CPC ........... H01L 21/67248; H01L 21/6833; H01L 21/67103; H01L 21/67109; C23C 4/00; C23C 16/505; H05B 3/68; H05B 3/02
USPC .......................... 156/345.27; 118/723 E, 724
See application file for complete search history.

(56) References Cited

U.S. PATENT DOCUMENTS

| | | |
|---|---|---|
| 2014/0154819 A1 | 6/2014 | Gaff |
| 2014/0263169 A1 | 9/2014 | Lee et al. |
| 2015/0228513 A1 | 8/2015 | Parkhe et al. |
| 2015/0255258 A1* | 9/2015 | Nozawa .............. C23C 16/4584 118/723 MW |

FOREIGN PATENT DOCUMENTS

| | | |
|---|---|---|
| JP | 2016-100473 A | 5/2016 |
| JP | 2017512385 A | 5/2017 |
| WO | 2017/029876 A1 | 2/2017 |

\* cited by examiner

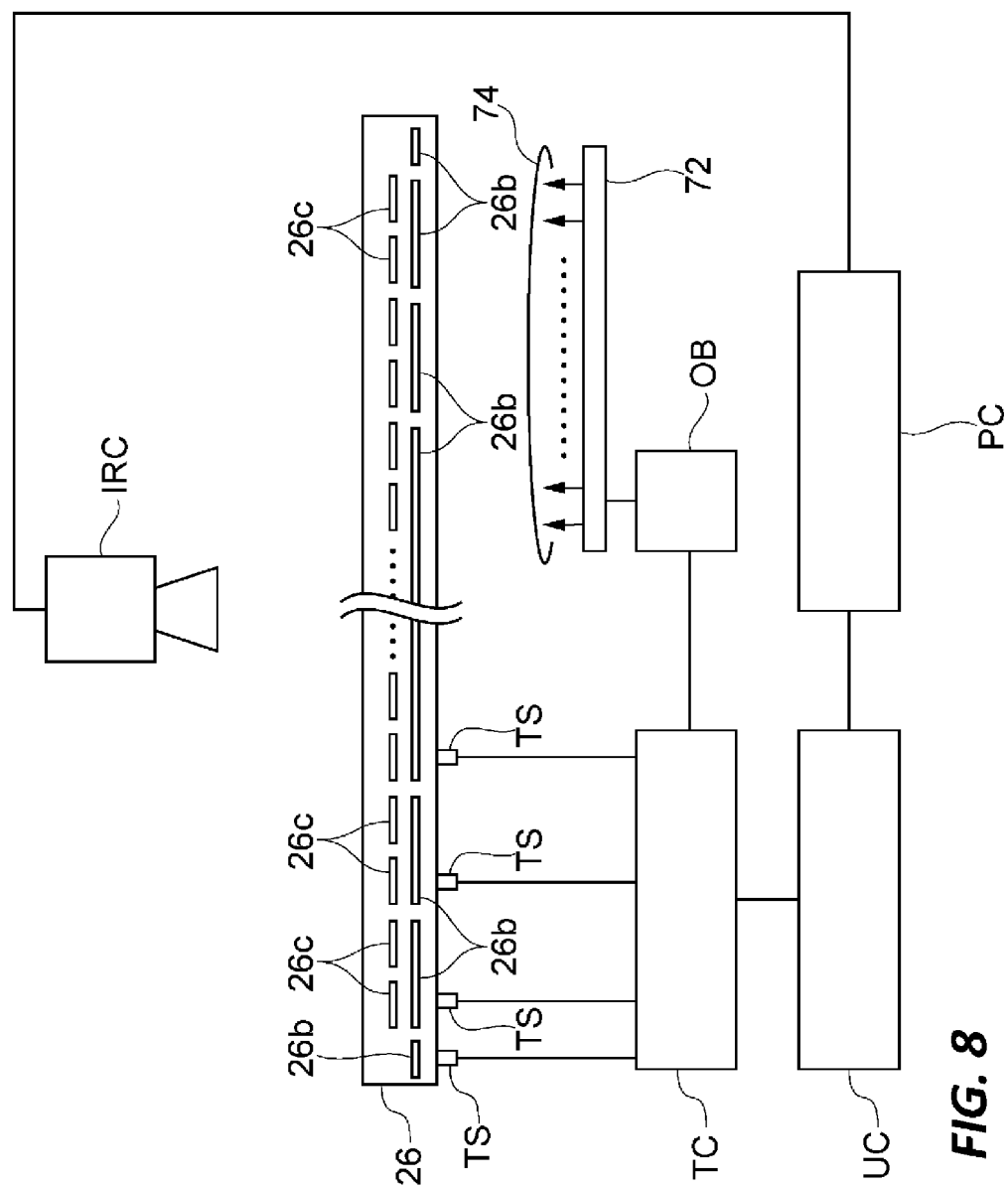

STAGE AND PLASMA PROCESSING APPARATUS

CROSS-REFERENCE TO RELATED APPLICATIONS

This application is a continuation of U.S. application Ser. No. 15/989,518 filed May 25, 2018, now U.S. Pat. No. 10,886,109, issued Jan. 5, 2021, which is based on and claims priority from Japanese Patent Application No. 2017-106736 filed on May 30, 2017, with the Japan Patent Office, the disclosures of which are incorporated herein in their entirety by reference.

TECHNICAL FIELD

An exemplary embodiment of the present disclosure relates to a stage and a plasma processing apparatus.

BACKGROUND

A plasma processing apparatus is used to manufacture an electronic device such as a semiconductor device. In general, the plasma processing apparatus has a chamber main body and a stage. The chamber main body provides an internal space thereof as a chamber. The stage is provided in the chamber. The stage is configured to support a substrate placed on the stage.

The stage includes an electrostatic chuck. The electrostatic chuck has a base and a chuck main body. A high-frequency power source is connected to the base. The chuck main body is provided on the base. The chuck main body is configured to generate electrostatic attractive force between the chuck main body and the substrate placed on the chuck main body, thereby holding the substrate using the generated electrostatic attractive force.

An in-plane temperature distribution of the substrate is important to the plasma processing performed using the plasma processing apparatus. Therefore, the stage needs to control the in-plane temperature distribution of the substrate. A plurality of heaters (resistance heating heaters) are provided in the chuck main body in order to control the in-plane temperature distribution of the substrate. The plurality of heaters are driven by alternating current from an alternating current power source. Japanese Patent Laid-Open Publication No. 2016-006875 discloses a plasma processing apparatus having the aforementioned stage.

SUMMARY

In one aspect, a stage for a plasma processing apparatus is provided. The stage has a power feeding unit and an electrostatic chuck. The power supply unit provides a transmission path for transmitting high-frequency waves from the high-frequency power source. The electrostatic chuck has a base and a chuck main body. The base has conductivity, is provided on the power feeding unit, and is electrically connected to the power feeding unit. The chuck main body is provided on the base and configured to hold a substrate with electrostatic attractive force. The chuck main body has a plurality of first heaters and a plurality of second heaters. The plurality of first heaters are provided in the chuck main body so as to be distributed on a plane in the chuck main body which is orthogonal to a central axis of the chuck main body. The number of second heaters is larger than the number of first heaters. The plurality of second heaters are provided in the chuck main body so as to be distributed on a separate plane in the chuck main body which is orthogonal to a central axis of the chuck main body. The stage further includes a first heater controller and a second heater controller. The first heater controller is configured to drive the plurality of first heaters by an alternating current output or a direct current output from a first power source. The second heater controller is configured to drive the plurality of second heaters by an alternating current output or a direct current output from a second power source which has electric power lower than electric power of the output from the first power source.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 8 is a view for explaining a technique for obtaining a function of converting a temperature increase amount caused by each of the plurality of second heaters into a power amount per predetermined time of each of a plurality of second outputs to be supplied to the plurality of second heaters.

DESCRIPTION OF EMBODIMENT

Figure 1:
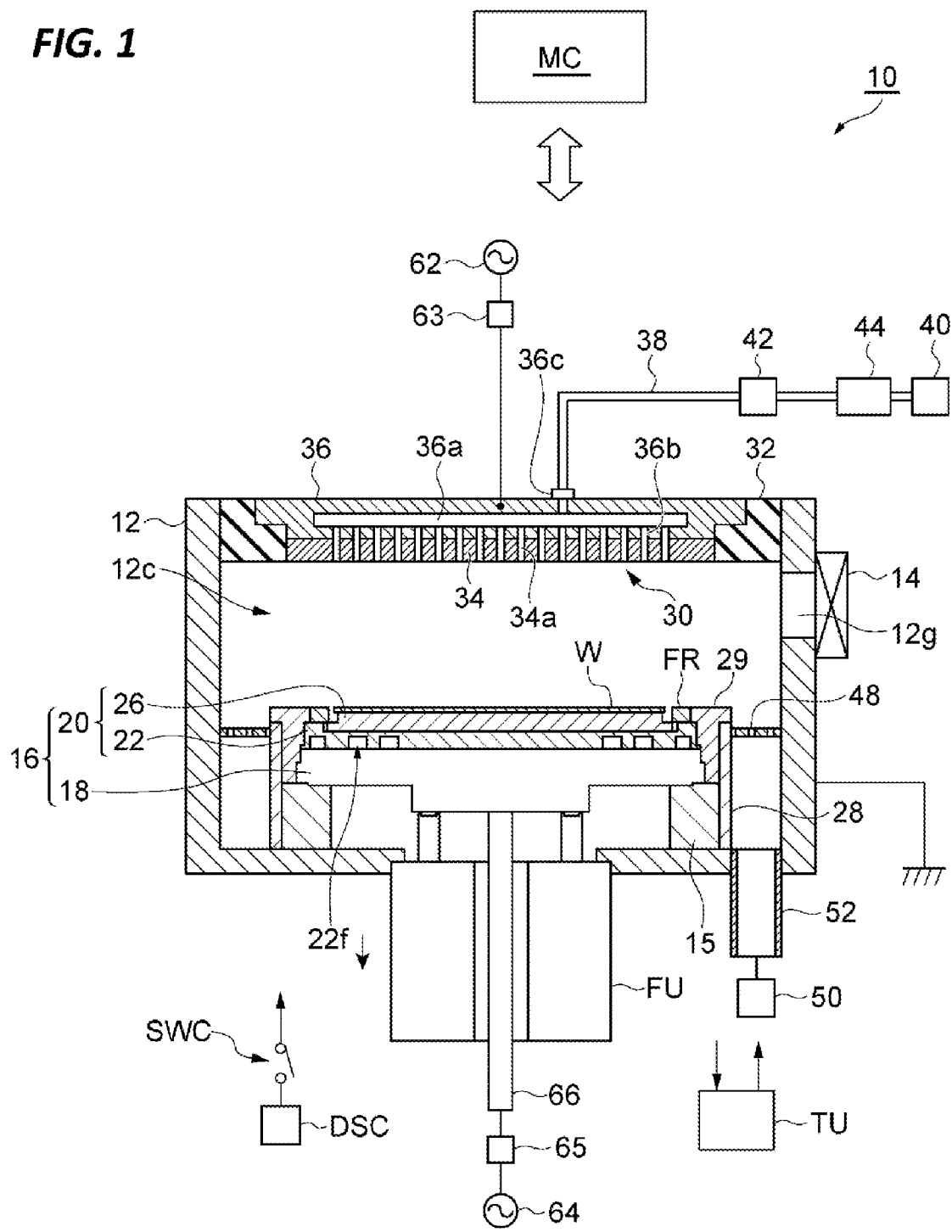
FIG. 1 is a view schematically illustrating a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

It is necessary to provide the plurality of heaters in the chuck main body in order to improve controllability of the in-plane temperature distribution of the substrate. As the number of heaters is increased, the number of power feeding lines for supplying alternating current outputs to the heaters is increased, and a rated electric current of each of the power feeding lines is decreased. Therefore, power of the alternating current output to be supplied to each of the heaters is decreased, and a temperature range, which may be set by each of the heaters, is narrowed. In consideration of this background, there is a need for a stage having a wide settable temperature range and capable of precisely controlling the in-plane temperature distribution of the substrate.

In one aspect, a stage for a plasma processing apparatus is provided. The stage has a power feeding unit and an electrostatic chuck. The power feeding unit provides a transmission path for transmitting high-frequency waves from the high-frequency power source. The electrostatic chuck has a base and a chuck main body. The base has conductivity, is provided on the power feeding unit, and is electrically connected to the power feeding unit. The chuck main body is provided on the base and configured to hold a substrate with electrostatic attractive force. The chuck main body has a plurality of first heaters and a plurality of second heaters. The plurality of first heaters are provided in the chuck main body so as to be distributed on a plane in the chuck main body which is orthogonal to a central axis of the chuck main body. The number second heaters is larger than the number of first heaters. The plurality of second heaters are provided in the chuck main body so as to be distributed on a separate plane in the chuck main body which is orthogonal to a central axis of the chuck main body. The stage further includes a first heater controller and a second heater controller. The first heater controller is configured to drive the plurality of first heaters by an alternating current output or a direct current output from a first power source. The second heater controller is configured to drive the plurality of second heaters by an alternating current output or a direct current output from a second power source which has electric power lower than electric power of the output from the first power source.

In the stage according to the aspect, the number of first heaters is smaller than the number of second heaters. That is, the number of first heaters is comparatively small. Therefore, the number of power feeding lines for the plurality of first heaters is decreased, and a rated electric current of each of the power feeding lines is increased. For this reason, a settable electric power range of the outputs to be supplied to the plurality of first heaters is widened, and a settable temperature range is widened. In addition, each of the comparatively plurality of second heaters may be driven by the output having comparatively low electric power. Therefore, the plurality of second heaters may precisely control the in-plane temperature distribution of the substrate even though each of the plurality of second heaters has a narrow settable temperature range. Since the stage according to the aspect has the plurality of first heaters and the plurality of second heaters, a temperature range settable by the stage is wide, and the stage may precisely control the in-plane temperature distribution of the substrate.

In one exemplary embodiment, the first heater controller is configured to drive the plurality of first heaters by the alternating current of the alternating current output from the first power source. The second heater controller is configured to drive the plurality of second heaters by the direct current of the direct current output from the second power source.

In one exemplary embodiment, the plurality of first heaters are provided coaxially with respect to a central axis of the chuck main body. The plurality of second heaters are provided in a central zone which intersects the central axis of the chuck main body and the plurality of zones which surround the central zone and are arranged in the circumferential direction within the plurality of regions coaxial with the central axis of the chuck main body. According to the exemplary embodiment, a temperature distribution in a radial direction of the substrate is controlled by the plurality of first heaters, and temperature distributions in the radial direction and a circumferential direction of the substrate are controlled by the plurality of second heaters.

In one exemplary embodiment, the chuck main body has a rear surface which is a surface facing the base, and an upper surface which is a surface opposite to the rear surface. The plurality of second heaters are provided between the plurality of first heaters and the upper surface. In this exemplary embodiment, the plurality of second heaters are closer to the upper surface of the chuck main body, that is, the surface on which the substrate is placed than the plurality of first heaters are to the upper surface of the chuck main body. Therefore, it is possible to further improve controllability of the in-plane temperature distribution of the substrate.

In one exemplary embodiment, the stage further includes a plurality of first power feeding lines and a plurality of second power feeding lines. The plurality of first power feeding lines are electrically connected to the plurality of first heaters, respectively. The plurality of second power feeding lines are electrically connected to the plurality of second heaters, respectively. The first heater controller is configured to produce a plurality of first outputs by distributing the output of the first power source and to supply the plurality of first outputs, which have individually adjusted power amounts, to the plurality of first heaters through the plurality of first power feeding lines. The second heater controller is configured to produce a plurality of second outputs by distributing the output of the second power source and to supply the plurality of second outputs, which have individually adjusted power amounts, to the plurality of second heaters through the plurality of second power feeding lines. The power feeding unit defines an accommodation space surrounded by the transmission path. The plurality of first power feeding lines, the first heater controller, the plurality of second power feeding lines, and the second heater controller are disposed in the accommodation space. According to this exemplary embodiment, since the output is distributed to the plurality of first heaters in the accommodation space surrounded by the transmission path, the number of filters, which are required to inhibit an inflow of the high-frequency waves to the first power source from the stage, may be reduced. In addition, since the output is distributed to the plurality of second heaters in the accommodation space surrounded by the transmission path, the number of filters, which are required to inhibit an inflow of the high-frequency waves to the second power source from the stage, may be reduced. Therefore, deterioration in impedance properties of the filter is inhibited, and a loss of the high-frequency waves is inhibited.

In one exemplary embodiment, the plurality of first outputs have substantially the same and constant electric power, and the first heater controller is configured to control a plurality of first duty ratios which are ratios of supply durations for which the plurality of first outputs are supplied to the plurality of first heaters, respectively, relative to a predetermined duration. The plurality of second outputs have substantially the same and constant electric power, and the second heater controller is configured to control a plurality of second duty ratios which are ratios of supply durations for which the plurality of second outputs are supplied to the plurality of second heaters, respectively, relative to a predetermined duration. In this exemplary embodiment, the power amounts of the plurality of first outputs for driving the plurality of first heaters are adjusted by the plurality of first duty ratios, respectively, and the power amounts of the plurality of second outputs for driving the plurality of second heaters are adjusted by the plurality of second duty ratios, respectively. According to this exemplary embodiment, it is possible to adjust the power amounts of the plurality of second outputs for driving the plurality of second heaters without mounting a plurality of power control circuits (e.g., DC/DC converters) in the second heater controller.

In one exemplary embodiment, the stage further includes a plurality of temperature sensors provided to measure temperatures of the plurality of zones in which the plurality of first heaters are disposed. The first heater controller is configured to adjust the plurality of first duty ratios so as to reduce an error between a target temperature and a measured value of a temperature measured by each of the plurality of temperature sensors or to reduce an error between the target temperature and a moving average value obtained from time-series data of the measured value of the temperature measured by each of the plurality of temperature sensors. The second heater controller is configured to adjust the plurality of second duty ratios so as to reduce an error between a target value and the product of the measured value of electric power of each of the plurality of second outputs and the corresponding second duty ratio among the plurality of second duty ratios or to reduce an error between the target value and a moving average value obtained from time-series data of the product of the measured value of electric power of each of the plurality of second outputs and the corresponding second duty ratio. In this exemplary embodiment, the plurality of second outputs to be supplied to the plurality of second heaters are controlled based on the product of the measured value of electric power and the second duty ratio or based on the moving average value, instead of based on the measured values of the temperatures of the zones in which the plurality of second heaters are disposed. Therefore, the number of temperature sensors to be provided in the stage is reduced.

In one exemplary embodiment, the chuck main body has a substrate mounting region in which the substrate is placed, and an outer circumferential region which surrounds the substrate mounting region from the outside in the radial direction with respect to the central axis. A plurality of terminals, which are electrically connected to the plurality of first power feeding lines and the plurality of second power feeding lines, are provided within the outer circumferential region. The plurality of terminals are undesirable temperature properties in terms of controlling the temperature of the substrate. In this exemplary embodiment, the plurality of terminals are provided within the outer circumferential region, and no terminal is provided within the substrate mounting region, such that influences of the plurality of terminals on the control of the temperature of the substrate are inhibited.

In one exemplary embodiment, the plurality of terminals are distributed around the entire circumference of the outer circumferential region.

In one exemplary embodiment, the plurality of second heaters are provided within the substrate mounting region, and some of the plurality of first heaters are provided at least within the outer circumferential region.

According to another aspect, a plasma processing apparatus is provided. The plasma processing apparatus includes a chamber main body which provides a chamber, any of the stages according to the aforementioned aspect and the aforementioned various exemplary embodiments, and a high-frequency power source. The electrostatic chuck is provided in the chamber. The high-frequency power source is electrically connected to the power feeding unit.

In one exemplary embodiment, the plasma processing apparatus further includes a first filter and a second filter. The first filter inhibits an inflow of high-frequency waves to the first power source. The first filter partially constitutes a power feeding line between the first power source and the first heater controller and is provided outside the power feeding unit with respect to the accommodation space. The second filter inhibits an inflow of high-frequency waves to the second power source. The second filter partially constitutes a power feeding line between the second power source and the second heater controller and is provided outside the power feeding unit with respect to the accommodation space.

As described above, there is provided the stage having a wide settable temperature range and capable of precisely controlling the in-plane temperature distribution of the substrate.

Hereinafter, various exemplary embodiments will be described in detail with reference to the drawings. Further, in the respective drawings, like reference numerals denote like parts or corresponding parts.

FIG. 1 is a view schematically illustrating a plasma processing apparatus according to an exemplary embodiment. FIG. 1 schematically illustrates a longitudinal sectional structure of a plasma processing apparatus 10 according to an exemplary embodiment. The plasma processing apparatus 10 illustrated in FIG. 1 is a capacitively coupled plasma processing apparatus.

The plasma processing apparatus 10 has a chamber main body 12. The chamber main body 12 has a roughly cylindrical shape. The chamber main body 12 provides an internal space thereof as a chamber 12c. The chamber main body 12 is made of, for example, aluminum. The chamber main body 12 is connected to ground potential. A plasma-resistant film is formed on an inner wall surface of the chamber main body 12, that is, a wall surface that defines the chamber 12c. The film may be a film formed by an anodization treatment or a ceramic film such as a film made of an yttrium oxide. A passageway 12g is formed in a sidewall of the chamber main body 12. A substrate W passes through the passageway 12g when the substrate W is loaded into the chamber 12c and when the substrate W is unloaded from the chamber 12c. A gate valve 14 is mounted on the sidewall of the chamber main body 12. The passageway 12g is openable or closable by the gate valve 14.

In the chamber 12c, a support unit 15 extends upward from a bottom portion of the chamber main body 12. The support unit 15 has a roughly cylindrical shape and is made of an insulating material such as quartz. A stage 16 is placed on the support unit 15. The stage 16 is supported by the support unit 15.

The stage 16 is configured to support the substrate W in the chamber 12c. The stage 16 includes a power feeding unit 18 and an electrostatic chuck 20. The power feeding unit 18 provides a transmission path for transmitting high-frequency waves from a high-frequency power source to be described below. The electrostatic chuck 20 is provided on the power feeding unit 18. The electrostatic chuck 20 includes a base 22 and a chuck main body 26. The base 22 has conductivity and constitutes a lower electrode. The base 22 is provided on the power feeding unit 18 and electrically connected to the power feeding unit 18.

A flow path 22f is provided in the base 22. The flow path 22f is a flow path for a heat exchange medium. The heat exchange medium is, for example, a refrigerant. The heat exchange medium is supplied to the flow path 22f from a chiller unit TU provided outside the chamber main body 12.

The heat exchange medium supplied to the flow path 22f returns back to the chiller unit TU. As described above, the heat exchange medium is supplied to the flow path 22f so that the heat exchange medium circulates between the flow path 22f and the chiller unit.

The chuck main body 26 is provided on the base 22. The chuck main body 26 is fixed to the base 22 by, for example, an adhesive. The chuck main body 26 is configured to hold the substrate W with electrostatic attractive force. An electrode 26a is provided in the chuck main body 26 (see FIG. 2). The electrode 26a is a film-shaped electrode. A direct current power source DSC is connected to the electrode 26a via a switch SWC. When voltage is applied to the electrode 26a from the direct current power source DSC, the electrostatic attractive force is generated between the chuck main body 26 and the substrate W placed on the chuck main body 26. The substrate W is attracted to the chuck main body 26 by the generated electrostatic attractive force, and the substrate W is held by the chuck main body 26. In addition, the plasma processing apparatus 10 provides a gas supply line for supplying a heat transfer gas, for example, He gas between an upper surface of the chuck main body 26 and a rear surface of the substrate W from a gas supply mechanism.

A cylindrical portion 28 extends upward from the bottom portion of the chamber main body 12. The cylindrical portion 28 extends along an outer circumference of the support unit 15. The cylindrical portion 28 has conductivity and has a roughly cylindrical shape. The cylindrical portion 28 is connected to ground potential. An insulating unit 29 is provided on the support unit 15. The insulating unit 29 has an insulation property and is made of ceramics such as quartz. The insulating unit 29 has a roughly cylindrical shape and extends along an outer circumference of the power feeding unit 18 and an outer circumference of the electrostatic chuck 20. A focus ring FR is mounted within outer circumferential regions of the base 22 and the chuck main body 26. The focus ring FR has a roughly annular plate shape and is made of, for example, silicon or a silicon oxide. The focus ring FR is provided to surround an edge of a substrate mounting region of the chuck main body 26 and surround an edge of the substrate W.

The plasma processing apparatus 10 further includes an upper electrode 30. The upper electrode 30 is provided above the stage 16. The upper electrode 30, together with a member 32, closes an upper opening of the chamber main body 12. The member 32 has an insulation property. The upper electrode 30 is supported at an upper side of the chamber main body 12 by the member 32.

The upper electrode 30 includes a top plate 34 and a support body 36. A lower surface of the top plate 34 defines the chamber 12c. A plurality of gas discharge holes 34a are provided in the top plate 34. Each of the plurality of gas discharge holes 34a penetrates the top plate 34 in a plate thickness direction (vertical direction). The top plate 34 is made of, but not limited to, for example, silicon. Alternatively, the top plate 34 may have a structure in which a plasma-resistant film is provided on a surface of a base material made of aluminum. The film may be a film formed by an anodization treatment or a ceramic film such as a film made of an yttrium oxide.

The support body 36 is a component for supporting the top plate 34 so that the top plate 34 is detachably mounted. The support body 36 may be made of an electrically conductive material such as, for example, aluminum. A gas diffusion chamber 36a is provided in the support body 36. A plurality of gas holes 36b extend downward from the gas diffusion chamber 36a. The plurality of gas holes 36b communicate with the plurality of gas discharge holes 34a, respectively. A gas introducing port 36c, which guides gas into the gas diffusion chamber 36a, is formed in the support body 36, and a gas supply pipe 38 is connected to the gas introducing port 36c.

A gas source group 40 is connected to the gas supply pipe 38 via a valve group 42 and a flow rate controller group 44. The gas source group 40 includes a plurality of gas sources. The valve group 42 includes a plurality of valves, and the flow rate controller group 44 includes a plurality of flow rate controllers. Each of the plurality of flow rate controllers of the flow rate controller group 44 is a mass flow controller or a pressure-control flow rate controller. Each of the plurality of gas sources of the gas source group 40 is connected to the gas supply pipe 38 via the corresponding valve of the valve group 42 and the corresponding flow rate controller of the flow rate controller group 44. The plasma processing apparatus 10 may supply the chamber 12c with gas from one or more gas sources selected from the plurality of gas sources of the gas source group 40 at an individually adjusted flow rate.

A baffle plate 48 is provided between the cylindrical portion 28 and the sidewall of the chamber main body 12. The baffle plate 48 may be configured by, for example, coating a base material made of aluminum with ceramics such as an yttrium oxide. A plurality of through holes are formed in the baffle plate 48. Below the baffle plate 48, a gas discharge pipe 52 is connected to the bottom portion of the chamber main body 12. A gas discharge device 50 is connected to the gas discharge pipe 52. The gas discharge device 50 has a pressure controller such as an automatic pressure control valve, and a vacuum pump such as a turbo molecular pump, and may reduce pressure in the chamber 12c.

The plasma processing apparatus 10 further includes a first high-frequency power source 62. The first high-frequency power source 62 is a power source that generates first high-frequency waves for generating plasma. The first high-frequency waves have a frequency ranging from 27 to 100 MHz, for example, a frequency of 60 MHz. The first high-frequency power source 62 is connected to the upper electrode 30 via a matching device 63. The matching device 63 has a circuit for matching output impedance of the first high-frequency power source 62 with impedance at a load side (upper electrode 30 side). Further, the first high-frequency power source 62 may be connected to the power feeding unit 18 via the matching device 63. The upper electrode 30 is connected to the ground potential in the case in which the first high-frequency power source 62 is connected to the power feeding unit 18.

The plasma processing apparatus 10 further includes a second high-frequency power source 64. The second high-frequency power source 64 is a power source that generates second high-frequency bias waves for putting ions into the substrate W. The frequency of the second high-frequency waves is lower than the frequency of the first high-frequency waves. The second high-frequency waves have a frequency ranging from 400 kHz to 13.56 MHz, for example, a frequency of 400 kHz. The second high-frequency power source 64 is connected to the power feeding unit 18 via a matching device 65 and a power supplier 66. The matching device 65 has a circuit for matching output impedance of the second high-frequency power source 64 with impedance at the load side (power feeding unit 18 side).

In one exemplary embodiment, the plasma processing apparatus 10 may further include a main control unit MC.

The main control unit MC is a computer having a processor, a storage device, an input device, a display device, and the like, and controls respective parts of the plasma processing apparatus 10. Specifically, the main control unit MC executes a control program stored in the storage device and controls respective parts of the plasma processing apparatus 10 based on recipe data stored in the storage device. Therefore, the plasma processing apparatus 10 is configured to perform a process assigned based on the recipe data.

Figure 2:
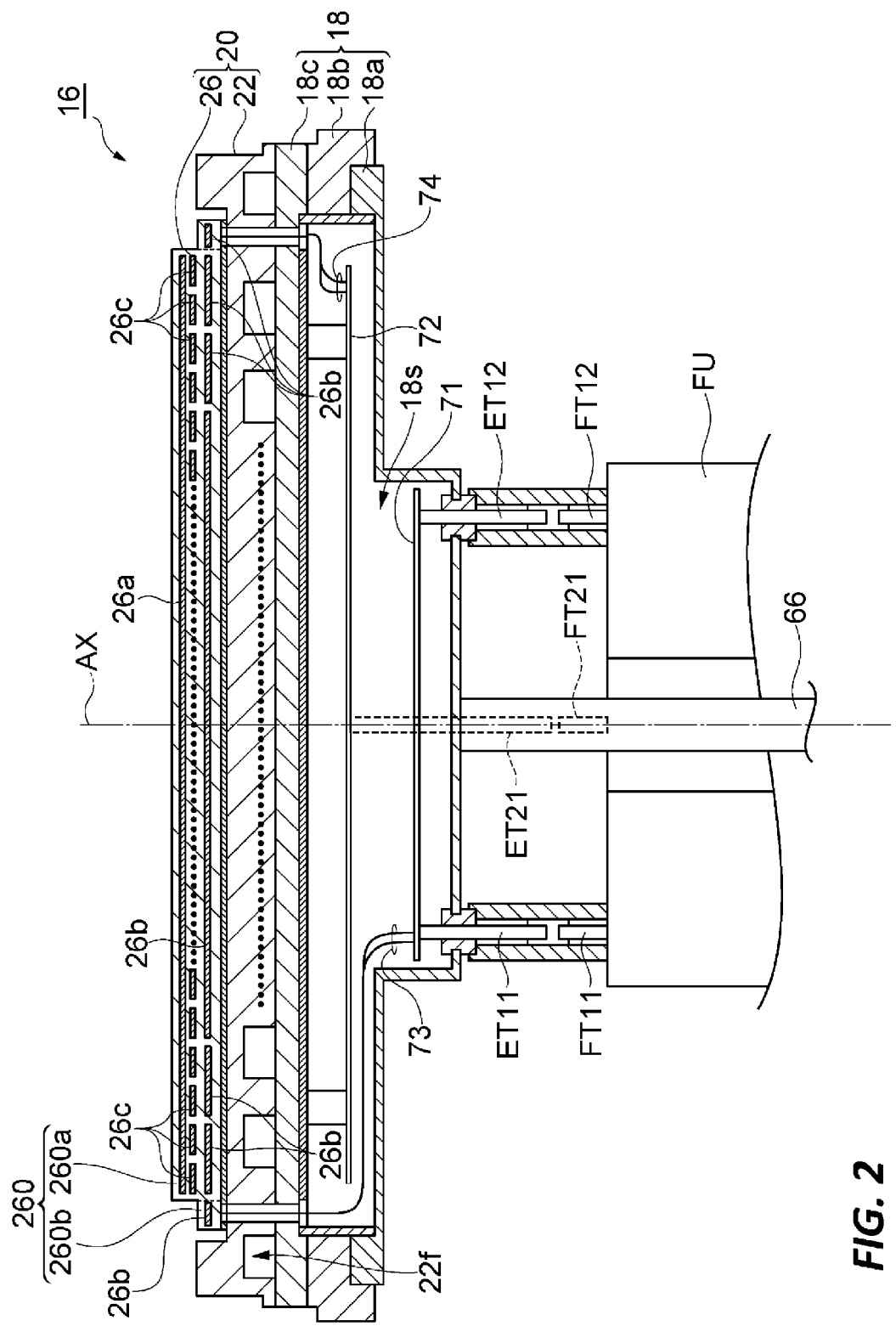
FIG. 2 is a cross-sectional view of a stage according to the exemplary embodiment.
Figure 3:
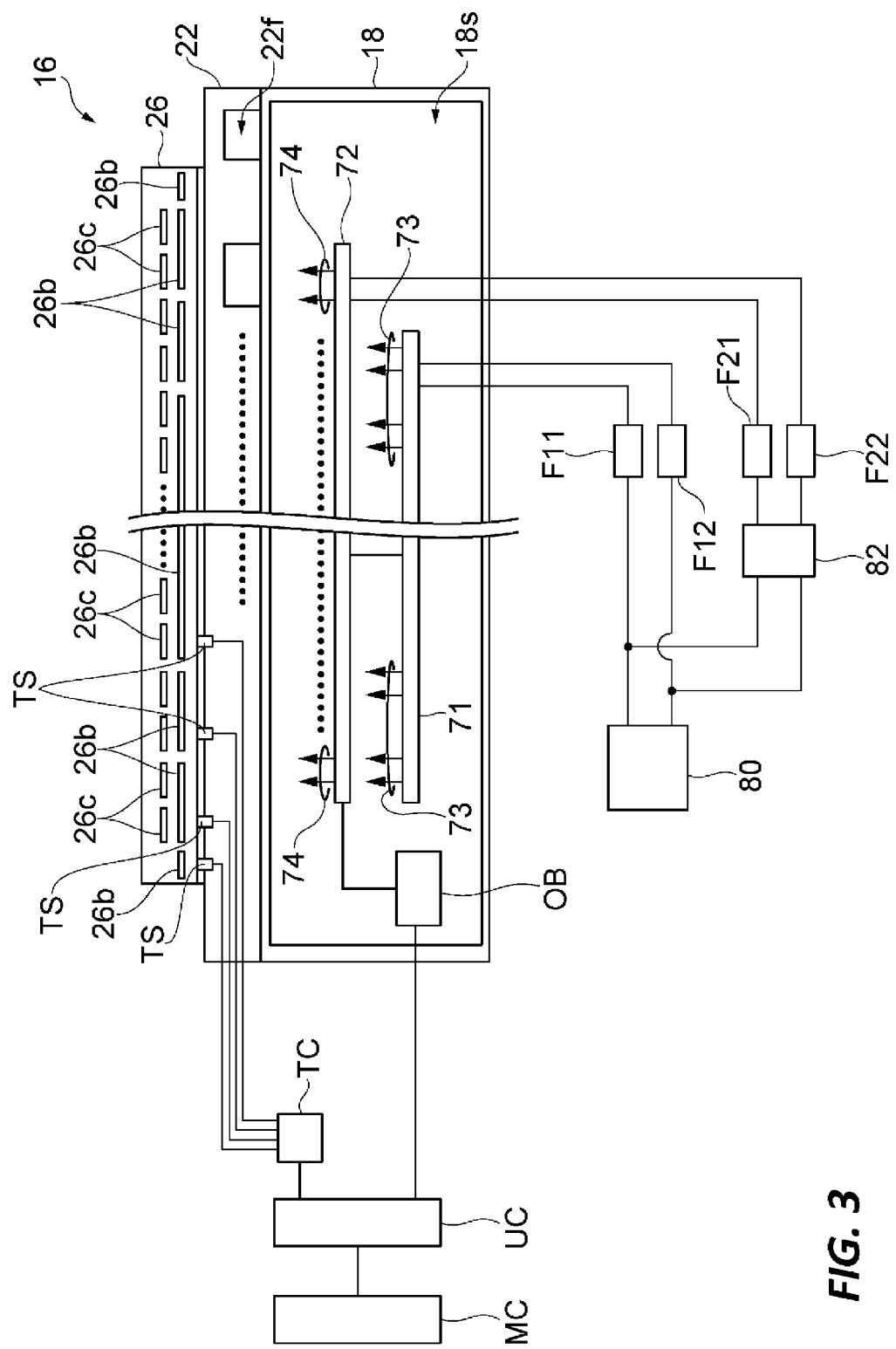
FIG. 3 is a view schematically illustrating the stage according to the exemplary embodiment together with other constituent components of the plasma processing apparatus.

Hereinafter, the stage 16 will be described in detail. FIG. 2 is a cross-sectional view of the stage according to the exemplary embodiment. FIG. 3 is a view schematically illustrating the stage according to the exemplary embodiment together with other constituent components of the plasma processing apparatus. As illustrated in FIGS. 2 and 3, the stage 16 has the power feeding unit 18 and the electrostatic chuck 20.

As described above, the power feeding unit 18 provides a transmission path for the high-frequency waves from the high-frequency power source (e.g., second high-frequency power source 64). The power feeding unit 18 has conductivity and is made of, for example, metal. The aforementioned power supplier 66 is connected to the power feeding unit 18. In one exemplary embodiment, the power feeding unit 18 provides an internal space thereof as an accommodation space 18s.

In one exemplary embodiment, the power feeding unit 18 has a first member 18a, a second member 18b, and a third member 18c. The first member 18a, the second member 18b, and the third member 18c have conductivity and are made of, for example, metal. The first member 18a is a member having a roughly circular shape in a plan view, and a central portion of the first member 18a protrudes downward. The power supplier 66 is connected to the central portion of the first member 18a. The second member 18b is mounted on the first member 18a and connected to the first member 18a. The second member 18b has a roughly ring shape. The third member 18c is mounted on the second member 18b and connected to the second member 18b. The third member 18c has a roughly disk shape. The first member 18a, the second member 18b, and the third member 18c constitute a transmission path for the high-frequency waves. The assembly including the first member 18a, the second member 18b, and the third member 18c defines the accommodation space 18s.

The electrostatic chuck 20 is provided on the power feeding unit 18. As described above, the electrostatic chuck 20 has the base 22 and the chuck main body 26. The base 22 has a roughly disk shape. As described above, the flow path 22f for the heat exchange medium is formed in the base 22. The base 22 has conductivity and is made of metal such as aluminum. The base 22 is provided on the power feeding unit 18 and electrically connected to the power feeding unit 18. The base 22 constitutes the lower electrode of the plasma processing apparatus 10.

The chuck main body 26 is provided on the base 22. The chuck main body 26 is fixed to the upper surface of the base 22 by, for example, an adhesive. The chuck main body 26 has a ceramic main body 260. The ceramic main body 260 is made of ceramics and has a roughly disk shape.

The ceramic main body 260 has a substrate mounting region 260a and an outer circumferential region 260b. The substrate mounting region 260a is a roughly disk-shaped region. An upper surface of the substrate mounting region 260a is an upper surface of the chuck main body 26 on which the substrate W is placed. The outer circumferential region 260b is a roughly annular plate-shaped region and extends to surround the substrate mounting region 260a.

That is, the outer circumferential region 260b extends, outside the substrate mounting region 260a, in a circumferential direction with respect to a central axis AX of the chuck main body 26 and the ceramic main body 260. The substrate mounting region 260a and the outer circumferential region 260b provide a continuous flat lower surface (rear surface) of the chuck main body 26. In the vicinity of a rear surface of the chuck main body 26, an upper surface of the outer circumferential region 260b extends further than the upper surface of the substrate mounting region 260a. As illustrated in FIG. 1, the focus ring FR is mounted within the outer circumferential region 260b.

The chuck main body 26 has the electrode 26a, a plurality of first heaters 26b, and a plurality of second heaters 26c. The electrode 26a extends in a direction orthogonal to the central axis AX in the substrate mounting region 260a. Each of the plurality of first heaters 26b and the plurality of second heaters 26c is a thin film resistance heater. The plurality of first heaters 26b and the plurality of second heaters 26c are provided in the ceramic main body 260. The plurality of first heaters 26b and the plurality of second heaters 26c are provided between the electrode 26a and the rear surface of the chuck main body 26. The plurality of first heaters 26b are distributed on a plane in the chuck main body 26 which is orthogonal to the central axis AX. The number of second heaters 26c is larger than the number of first heaters 26b. The plurality of second heaters 26c are distributed on a separate plane in the chuck main body 26 which is orthogonal to the central axis AX.

Figure 4:
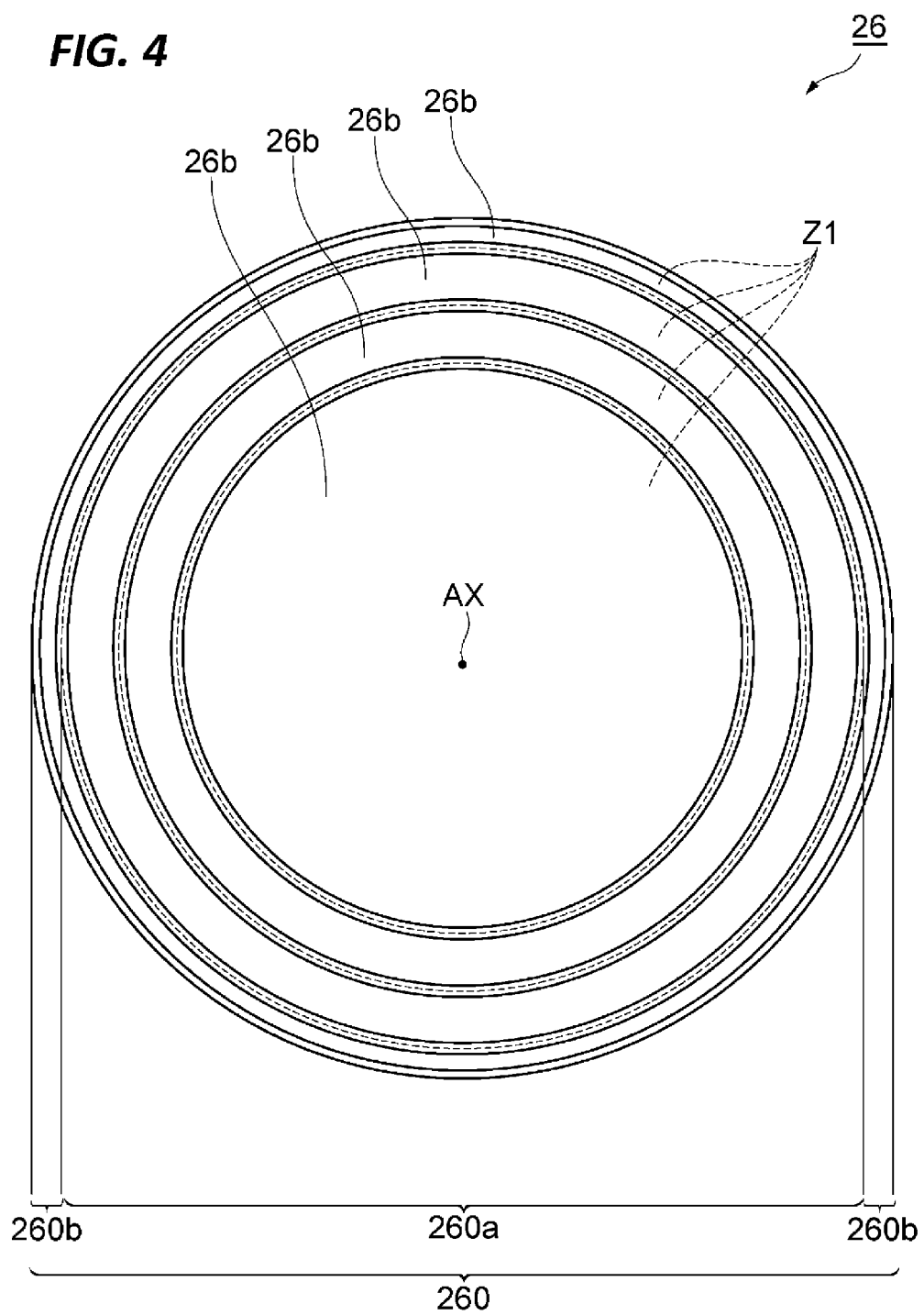
FIG. 4 is a top plan view illustrating an example of a layout of a plurality of first heaters of the stage illustrated in FIG. 2.

FIG. 4 is a top plan view illustrating an example of a layout of the plurality of first heaters of the stage illustrated in FIG. 2. FIG. 4 illustrates a layout of the plurality of first heaters 26b in the plane orthogonal to the central axis AX. As illustrated in FIG. 4, in one exemplary embodiment, the plurality of first heaters 26b are provided coaxially with respect to the central axis AX. Specifically, a plane shape of the first heater 26b, which is provided at a center among the plurality of first heaters 26b, is a circular shape. Another first heater 26b has an annular shape that surrounds the first heater 26b provided at the center. That is, the other first heaters 26b except for the first heater 26b provided at the center have a band shape extending in the circumferential direction. In one exemplary embodiment, some of the plurality of first heaters 26b are provided at least within the outer circumferential region 260b. For example, among the plurality of first heaters 26b, the first heater 26b, which extends at the outermost side with respect to the central axis AX, is provided within the outer circumferential region 260b, and the other first heaters 26b are provided within the substrate mounting region 260a. The plurality of first heaters 26b heat a plurality of zones Z1 in which the plurality of first heaters 26b are disposed, respectively.

The plurality of first heaters 26b may also be arranged in the circumferential direction with respect to the central axis AX. That is, the plurality of zones Z1 may have a central zone, and a plurality of zones which are arranged in the circumferential direction within the plurality of coaxial regions outside the central zone, and the plurality of first heaters 26b may be provided in the plurality of zones Z1, respectively.

Figure 5:
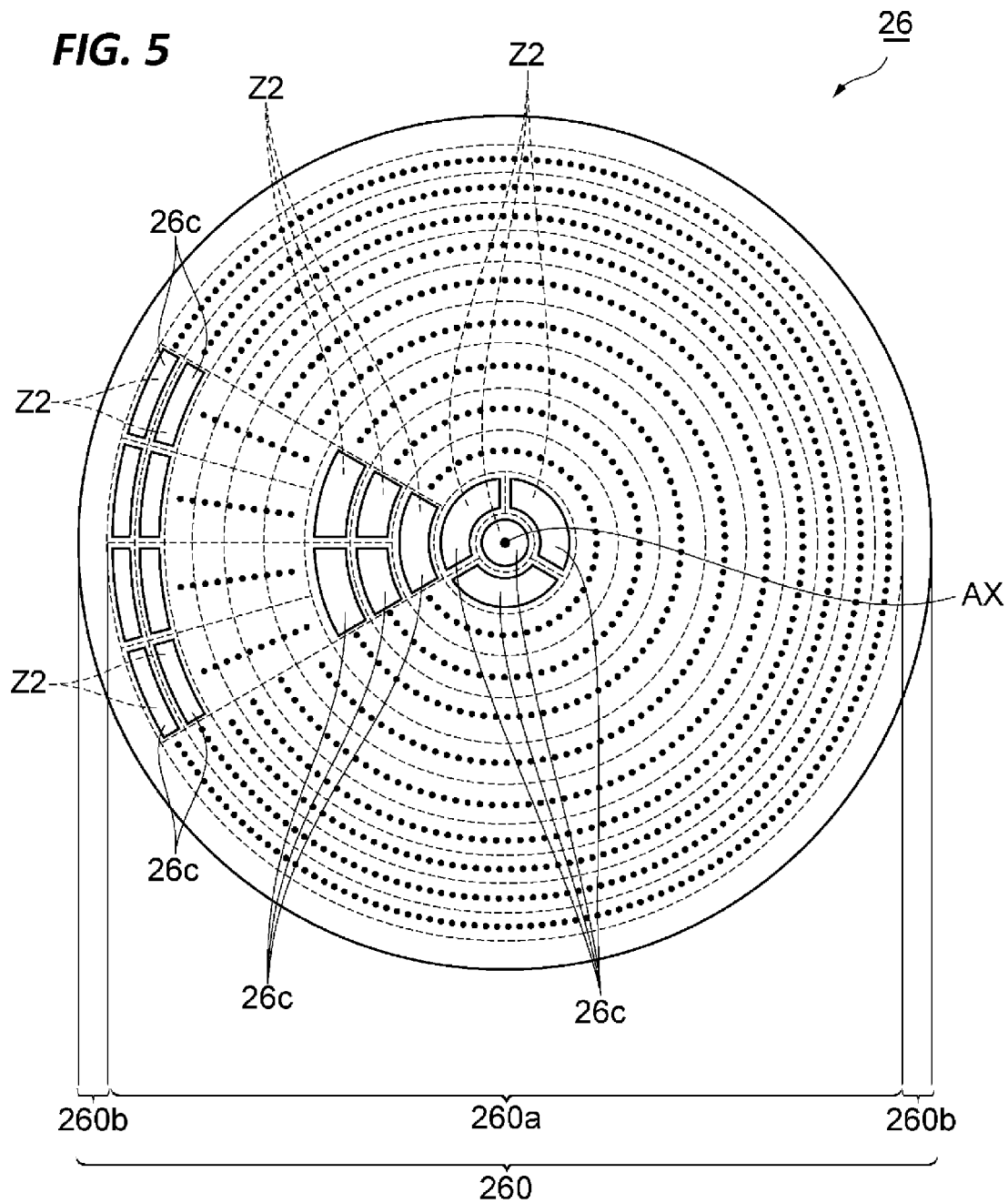
FIG. 5 is a top plan view illustrating an example of a layout of a plurality of second heaters of the stage illustrated in FIG. 2.

FIG. 5 is a top plan view illustrating an example of a layout of the plurality of second heaters of the stage illustrated in FIG. 2. FIG. 5 illustrates a layout of the plurality of second heaters 26c in the plane orthogonal to the central axis AX. The plurality of second heaters 26c are provided to be distributed within the substrate mounting region 260a. As illustrated in FIG. 5, as an example, the plurality of second heaters 26c are provided in a plurality of zones Z2, respectively. The plurality of zones Z2 include a central zone which intersects the central axis AX, and a plurality of zones which are arranged in the circumferential direction within a plurality of regions coaxial with respect to the central axis AX. Further, the plurality of zones Z2, that is, the plurality of second heaters 26c are included within any of the plurality of zones Z1.

As illustrated in FIGS. 2 and 3, the plurality of second heaters 26c are provided between the plurality of first heaters 26b and the upper surface of the chuck main body 26 (i.e., the upper surface of the substrate mounting region 260a). That is, the plurality of second heaters 26c are provided above the plurality of first heaters 26b. Further, the plurality of second heaters 26c may be provided below the plurality of first heaters 26b.

Figure 6:
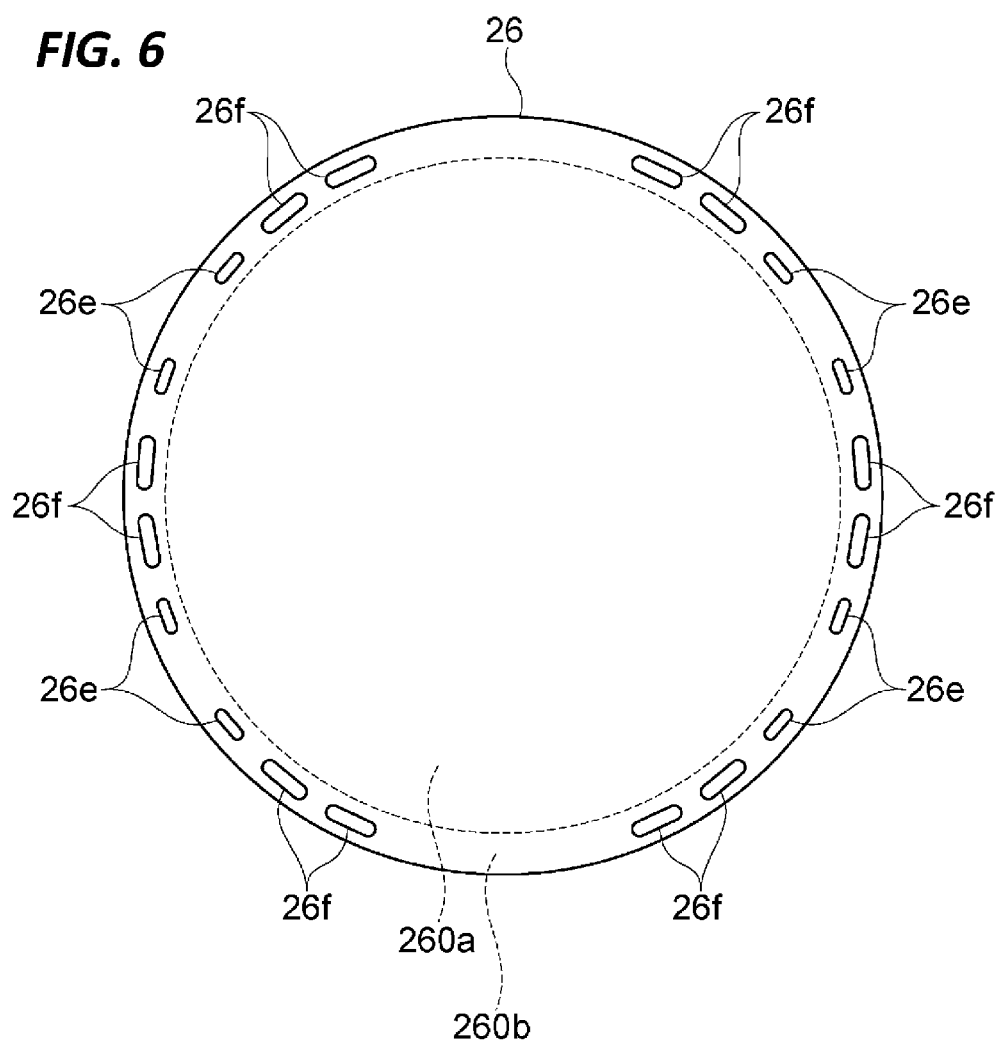
FIG. 6 is a top plan view illustrating an example of a layout of terminals on a rear surface of a chuck main body of the stage illustrated in FIG. 2.
Figure 7:
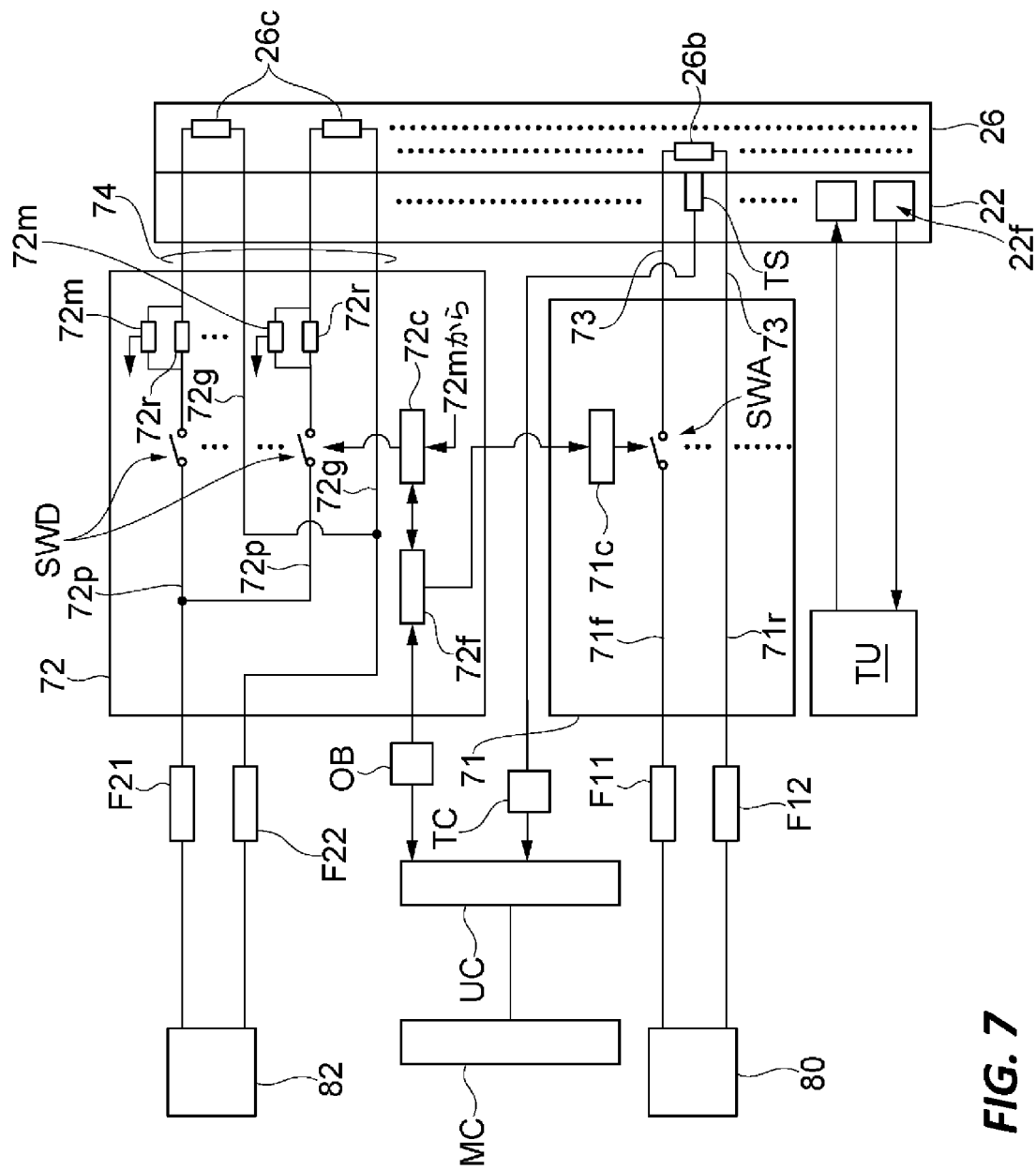
FIG. 7 is a view illustrating a configuration related to control of the stage illustrated in FIG. 2.

The plurality of first heaters 26b generate heat by being driven by an output from a first power source 80. The output of the first power source 80 is an alternating current output or a direct current output. That is, the output of the first power source 80 may be any one of an alternating current output and a direct current output. The plurality of second heaters 26c generate heat by being driven by an output from a second power source 82. The output of the second power source 82 is an alternating current output or a direct current output. That is, the output of the second power source 82 may be any one of an alternating current output and a direct current output. In one exemplary embodiment, the plurality of first heaters 26b are driven by an alternating current of the alternating current output from the first power source, and the plurality of second heaters 26c are driven by a direct current of the direct current output from the second power source. The stage 16 has a first heater controller 71 and a second heater controller 72 in order to drive the plurality of first heaters 26b and the plurality of second heaters 26c. Hereinafter, the reference is made to FIGS. 6 and 7 together with FIGS. 2 and 3. FIG. 6 is a top plan view illustrating an example of a layout of terminals on the rear surface of the chuck main body of the stage illustrated in FIG. 2. FIG. 7 is a view illustrating a configuration related to control of the stage illustrated in FIG. 2.

A plurality of first power feeding lines 73 are electrically connected to the plurality of first heaters 26b, respectively. The pair of first power feeding lines 73 is connected to the plurality of first heaters 26b, respectively. A plurality of second power feeding lines 74 are electrically connected to the plurality of second heaters 26c, respectively. The pair of second power feeding lines 74 is connected to the plurality of second heaters 26c, respectively. In the one exemplary embodiment, the plurality of second power feeding lines 74 may be provided by a plurality of flexible printed circuit boards. Each of the plurality of flexible printed circuit boards provides the several corresponding second power feeding lines 74 among the plurality of second power feeding lines 74. In one exemplary embodiment, the first heater controller 71, the plurality of first power feeding lines 73, the second heater controller 72, and the plurality of second power feeding lines 74 are provided in the accommodation space 18s.

As illustrated in FIG. 6, a plurality of terminals 26e and a plurality of terminals 26f are provided on the rear surface of the chuck main body 26. The plurality of first power feeding lines 73 are connected to the plurality of terminals 26e, respectively. The plurality of terminals 26e are connected to the plurality of first heaters 26b through inner wires in the chuck main body 26. The plurality of second power feeding lines 74 are connected to the plurality of terminals 26f, respectively. In a case in which the plurality of second power feeding lines 74 are provided by the plurality of flexible printed circuit boards, the plurality of terminals 26f are grouped as a plurality of terminal groups. The plurality of terminals 26f are connected to the plurality of second heaters 26c through inner wires in the chuck main body 26. In one exemplary embodiment, the plurality of terminals 26e and the plurality of terminals 26f are provided within the outer circumferential region 260b. In one exemplary embodiment, the plurality of terminals 26e and the plurality of terminals 26f (or the plurality of terminal groups) are distributed in the circumferential direction around the entire circumference of the outer circumferential region 260b.

The plurality of first power feeding lines 73 are connected to the first heater controller 71. The first heater controller 71 is connected to the first power source 80. The first heater controller 71 is configured to drive the plurality of first heaters 26b by the output from the first power source 80. In one exemplary embodiment, the first heater controller 71 is configured to drive the plurality of first heaters 26b by a plurality of first outputs produced by distributing the output from the first power source 80. The first heater controller 71 supplies the plurality of first outputs to the plurality of first heaters 26b through the plurality of first power feeding lines 73 in order to drive the plurality of first heaters 26b. The first heater controller 71 is configured to individually adjust power amounts of the plurality of first outputs to be supplied to the plurality of first heaters 26b. In one exemplary embodiment, the output from the first power source 80 is an alternating current output, and the first heater controller 71 is configured to drive the plurality of first heaters 26b by an alternating current of the plurality of first outputs which are alternating current outputs.

The plurality of second power feeding lines 74 are connected to the second heater controller 72. The second heater controller 72 is connected to the second power source 82. The second heater controller 72 is configured to drive the plurality of second heaters 26c by the output from the second power source 82. In one exemplary embodiment, the second heater controller 72 is configured to drive the plurality of second heaters 26c by a plurality of second outputs produced by distributing the output from the second power source 82. Electric power for driving the plurality of second heaters 26c is lower than electric power for driving the plurality of first heaters 26b. The second heater controller 72 supplies the plurality of second outputs to the plurality of second heaters 26c through the plurality of second power feeding lines 74 in order to drive the plurality of second heaters 26c. The second heater controller 72 is configured to individually adjust power amounts of the plurality of second outputs to be supplied to the plurality of second heaters 26c.

In one exemplary embodiment, the output from the second power source 82 is a direct current output, and the second heater controller 72 is configured to drive the plurality of second heaters 26c by a direct current of the plurality of second outputs which are direct current outputs. In a case in which the first power source 80 is an alternating current power source and the second power source 82 is a direct current power source, the second power source 82 is connected to the first power source 80 as illustrated. In this case, the second power source 82 is an AC/DC converter for converting the alternating current output from the first power source 80 into a direct current, and for example, the second power source 82 is a switching power source.

As illustrated in FIG. 7, a plurality of wires 71f and a plurality of wires 71r are provided in the first heater controller 71. One end of each of the plurality of wires 71f is connected to the corresponding first heater 26b, among the plurality of first heaters 26b, through the corresponding first power feeding line 73 among the plurality of first power feeding lines 73. One end of each of the plurality of wires 71r is connected to the corresponding first heater 26b, among the plurality of first heaters 26b, through the corresponding first power feeding line 73 among the plurality of first power feeding lines 73.

The other end of each of the plurality of wires 71f is connected to the first power source 80 via a filter F11 (first filter). Specifically, the other end of each of the plurality of wires 71f is connected to a terminal ET11 illustrated in FIG. 2, and the terminal ET11 is connected to a terminal FT11 of a filter unit FU. The filter unit FU has the filter F11, a filter F12 (first filter), a filter F21 (second filter), and a filter F22 (second filter). The filter unit FU including the filter F11, the filter F12, the filter F21, and the filter F22 is provided outside the power feeding unit 18 with respect to the aforementioned accommodation space 18s.

The terminal FT11 is connected to the filter F11. The filter F11 inhibits an inflow of the high-frequency waves to the first power source 80. The filter F11 is, for example, an LC filter. The terminal FT11 is connected to one end of a coil of the filter F11. The coil of the filter F11 partially constitutes a power feeding line between the first power source 80 and the first heater controller 71. The other end of the coil of the filter F11 is connected to the ground through a condenser of the filter F11.

The other end of each of the plurality of wires 71r is connected to the first power source 80 via the filter F12. Specifically, the other end of each of the plurality of wires 71r is connected to a terminal ET12 illustrated in FIG. 2, and the terminal ET12 is connected to a terminal FT12 of the filter unit FU. The terminal FT12 is connected to the filter F12. The filter F12 inhibits an inflow of the high-frequency waves to the first power source 80. The filter F12 is, for example, an LC filter. The terminal FT12 is connected to one end of a coil of the filter F12. The coil of the filter F12 partially constitutes a wire between the first power source 80 and the first heater controller 71. The other end of the coil of the filter F12 is connected to the ground through a condenser of the filter F12.

As illustrated in FIG. 7, a plurality of wires 72p and a plurality of wires 72g are provided in the second heater controller 72. One end of each of the plurality of wires 72p is connected to the corresponding second heater 26c, among the plurality of second heaters 26c, through the corresponding second power feeding line 74 among the plurality of second power feeding lines 74. One end of each of the plurality of wires 72g is connected to the corresponding second heater 26c, among the plurality of second heaters 26c, through the corresponding second power feeding line 74 among the plurality of second power feeding lines 74.

The other end of each of the plurality of wires 72p is connected to the second power source 82 via the filter F21. Specifically, the other end of each of the plurality of wires 72p is connected to a terminal ET21 illustrated in FIG. 2, and the terminal ET21 is connected to a terminal FT21 of the filter unit FU. The terminal FT21 is connected to the filter F21. The filter F21 inhibits an inflow of the high-frequency waves to the second power source 82. The filter F21 is, for example, an LC filter. The terminal FT21 is connected to one end of a coil of the filter F21. The coil of the filter F21 partially constitutes a power feeding line between the second power source 82 and the second heater controller 72. The other end of the coil of the filter F21 is connected to the ground through a condenser of the filter F21.

The other end of each of the plurality of wires 72g is connected to the second power source 82 via the filter F22. Specifically, the other end of each of the plurality of wires 72g is connected to a separate terminal, and the separate terminal is connected to a separate terminal of the filter unit FU. The separate terminal of the filter unit FU is connected to the filter F22. The filter F22 is a filter that inhibits an inflow of the high-frequency waves to the second power source 82. The filter F22 is, for example, an LC filter. The separate terminal of the filter unit FU is connected to one end of a coil of the filter F22. The coil of the filter F22 partially constitutes a wire between the ground of the second power source 82 and the second heater controller 72. The other end of the coil of the filter F22 is connected to the ground through a condenser of the filter F22.

As illustrated in FIG. 7, the first heater controller 71 has a control circuit 71c and a plurality of switching elements SWA. The plurality of switching elements SWA are provided on the plurality of wires 71f, respectively. Each of the plurality of switching elements SWA may be a semiconductor switching element, for example, a triac. The first heater controller 71 receives an output (e.g., an alternating current output of AC 200 V) from the first power source 80, and generates a plurality of first outputs (e.g., alternating current outputs of AC 200 V) for the plurality of first heaters 26b. In the first heater controller 71, a state in which the plurality of first outputs are supplied to the plurality of first heaters 26b and a state in which the supply of the plurality of first outputs is cut off are switched as a state of the plurality of switching elements SWA is switched between a conductive state and a cut-off state. The states of the plurality of switching elements SWA are set by the control circuit 71c. The control circuit 71c may be configured by, for example, a field-programmable gate array (FPGA) or an exclusive circuit.

As illustrated in FIGS. 3 and 7, the stage 16 is provided with a plurality of temperature sensors TS. The plurality of temperature sensors TS are mounted on the stage 16 so as to measure temperatures of the plurality of zones Z1 of the chuck main body 26. For example, the plurality of temperature sensors TS measure, at the rear surface of the chuck main body 26, the temperatures of the plurality of zones Z1. Each of the plurality of temperature sensors TS is, for example, a fluorescent temperature sensor. The plurality of temperature sensors TS are connected to a sensor circuit TC. An output of each of the plurality of temperature sensors TS is converted into an electrical digital signal for the sensor circuit TC, that is, a measured value of the temperature of each of the plurality of zones Z1. The measured value of the temperature of each of the plurality of zones Z1 is provided to an upper level controller UC.

The second heater controller 72 has an inner controller 72f, a control circuit 72c, and a plurality of switching elements SWD. The plurality of switching elements SWD are provided on the plurality of wires 72p, respectively. Each of the plurality of switching elements SWD may be a semiconductor switching element, for example, a photo MOS relay. The second heater controller 72 receives an output (e.g., direct current output of DC 15 V) from the second power source 82 and generates the plurality of second outputs for the plurality of second heaters 26c. In the second heater controller 72, a state in which the plurality of second outputs are supplied to the plurality of second heaters 26c and a state in which the supply of the plurality of second outputs is cut off are switched as a state of the plurality of switching elements SWD is switched between a conductive state and a cut-off state. The states of the plurality of switching elements SWD are set by the control circuit 72c. The control circuit 72c may be configured by, for example, an FPGA or an exclusive circuit.

A plurality of resistance elements 72r are provided on the plurality of wires 72p, respectively. The second heater controller 72 further has a plurality of measuring devices 72m. Each of the plurality of measuring devices 72m measures voltage between both ends of each of the plurality of resistance elements 72r and measures an electric current flowing through each of the plurality of wires 72p. Measured values of the voltage and measured values of the electric current acquired by the plurality of measuring devices 72m are provided to the upper level controller UC through the control circuit 72c, the inner controller 72f, and an optical bridge OB.

The inner controller 72f of the second heater controller 72 is connected to the upper level controller UC through the optical bridge OB. The inner controller 72f may be configured by, for example, a processor such as a CPU, or an FPGA. The inner controller 72f communicates with the upper level controller UC through the optical bridge OB and transmits control signals to the control circuit 71c and the control circuit 72c. The upper level controller UC may be configured by a microcomputer provided with a processor such as a CPU and a storage device such as a memory. In the plasma processing apparatus 10, set data of an in-plane temperature distribution of the substrate W are provided to the upper level controller UC from the main control unit MC.

Based on the set data of the in-plane temperature distribution of the substrate W, the upper level controller UC determines target temperatures of the plurality of zones Z1 and target values of power amounts per predetermined time of the plurality of second outputs. The upper level controller UC controls the control circuit 71c through the optical bridge OB and the inner controller 72f so that the plurality of first outputs of the power amounts (power amounts per predetermined time) in accordance with the target temperatures of the plurality of zones Z1 are supplied to the plurality of first heaters 26b. In response to the control by the upper level controller UC and the inner controller 72f, the control circuit 71c controls the power amounts of the plurality of first outputs to be supplied to the plurality of first heaters 26b.

The upper level controller UC performs feedback control of the power amounts of the plurality of first outputs supplied to the plurality of first heaters 26b so as to reduce errors between the target temperatures of the plurality of zones Z1 and the measured values of the temperatures of the plurality of zones Z1 which are acquired by the plurality of temperature sensors TS and the sensor circuit TC. The feedback control of the power amounts of the plurality of first outputs supplied to the plurality of first heaters 26b is, for example, PID control. Further, during the feedback control of the power amounts of the plurality of first outputs supplied to the plurality of first heaters 26b, the upper level controller UC may obtain errors between the target temperatures of the plurality of zones Z1 and a moving average value of the temperatures of the plurality of zones Z1 which are obtained from time-series data of the measured values of the temperatures of the plurality of zones Z1.

In one exemplary embodiment, the plurality of first outputs of the first heater controller 71 have substantially the same and constant electric power. In this exemplary embodiment, the first heater controller 71 is configured to control a plurality of first duty ratios. The plurality of first duty ratios are ratios between predetermined durations (e.g., 100 milliseconds) and supply durations for which the plurality of first outputs are supplied to the plurality of first heaters 26b. The upper level controller UC assigns the plurality of first duty ratios to the control circuit 71c through the optical bridge OB and the inner controller 72f. The control circuit 71c switches the respective states (the conductive state and the cut-off state) of the plurality of switching elements SWA within a predetermined time in accordance with the plurality of assigned first duty ratios. Therefore, the supply of the plurality of first outputs to the plurality of first heaters 26b and the cut-off of the supply of the plurality of first outputs to the plurality of first heaters 26b are alternately switched.

The upper level controller UC adjusts the plurality of first duty ratios so as to reduce the errors between the target temperatures of the plurality of zones Z1 and the measured values of the temperatures of the plurality of zones Z1 which are acquired by the plurality of temperature sensors TS and the sensor circuit TC. That is, the upper level controller UC performs feedback control of the plurality of first duty ratios. The feedback control of the plurality of first duty ratios is, for example, PID control. Further, during the feedback control of the plurality of first duty ratios, the upper level controller UC may obtain the errors between the target temperatures of the plurality of zones Z1 and the moving average value of the temperatures of the plurality of zones Z1 which are obtained from time-series data of the measured values of the temperatures of the plurality of zones Z1.

The upper level controller UC controls the control circuit 72c through the optical bridge OB and the inner controller 72f so that the plurality of second outputs in accordance with the target values of the power amounts per predetermined time, which is determined based on the set data of the in-plane temperature distribution of the substrate W, are supplied to the plurality of second heaters 26c. In response to the control by the upper level controller UC and the inner controller 72f, the control circuit 72c controls the power amounts (power amounts per predetermined time) of the plurality of second outputs to be supplied to the plurality of second heaters 26c.

Based on the plurality of measured values of electric power, the upper level controller UC performs the feedback control of the power amounts of the plurality of second outputs. The feedback control of the power amounts of the plurality of second outputs is, for example, PID control. Each of the plurality of measured values of electric power is the product of the measured value of voltage and the measured value of electric current which are acquired by the corresponding measuring device 72m among the plurality of measuring devices 72m. Further, in the case in which each of the plurality of second outputs is an alternating current output, each of the plurality of measured values of electric power may be a root-mean-square value obtained from the product of the measured value of voltage and the measured value of electric current which are acquired by the corresponding measuring device 72m among the plurality of measuring devices 72m. In another exemplary embodiment, each of the power amounts of the plurality of second outputs may be controlled based on the time-series moving average value of the product of the measured value of voltage and the measured value of electric current which are acquired by the corresponding measuring device 72m among the plurality of measuring devices 72m. Further, in the case in which each of the plurality of second outputs is an alternating current output, each of the plurality of measured values of electric power may be a time-series moving average value of the root-mean-square value obtained from the product of the measured value of voltage and the measured value of electric current which are acquired by the corresponding measuring device 72m among the plurality of measuring devices 72m.

In one exemplary embodiment, the plurality of second outputs of the second heater controller 72 have substantially the same and constant electric power. In this exemplary embodiment, the second heater controller 72 is configured to control plurality of second duty ratios. The plurality of second duty ratios are ratios between predetermined durations (e.g., 100 milliseconds) and supply durations for which the plurality of second outputs are supplied to the plurality of second heaters 26c. The upper level controller UC assigns the plurality of second duty ratios to the control circuit 71c through the optical bridge OB and the inner controller 72f. The control circuit 72c switches the respective states (the conductive state and the cut-off state) of the plurality of switching elements SWD within a predetermined time in accordance with the plurality of assigned second duty ratios. Therefore, the supply of the plurality of second outputs to the plurality of second heaters 26c and the cut-off of the supply of the plurality of second outputs to the plurality of second heater 26c are alternately switched.

The upper level controller UC adjusts the plurality of second duty ratios so as to reduce an error between the target value of the power amount and the product of the measured value of electric power of each of the plurality of second outputs and the corresponding second duty ratio among the plurality of second duty ratios. That is, the upper level controller UC performs feedback control of the plurality of second duty ratios. The feedback control of the plurality of second duty ratios is, for example, PID control. Further, during the feedback control of the plurality of second duty ratios, the upper level controller may obtain an error between the target value and the time-series moving average value of the product of the measured value of electric power of each of the plurality of second outputs and the corresponding second duty ratio.

As described above, based on the set data of the in-plane temperature distribution of the substrate W, the upper level controller UC determines the target values of the power amounts per predetermined time of the plurality of second outputs. Specifically, the upper level controller UC determines target temperature increase amounts caused by the plurality of second heaters 26c based on the set data of the in-plane temperature distribution of the substrate W, and determines the target values of the power amounts per predetermined time of the second outputs to be supplied to the plurality of second heaters 26c based on the target temperature increase amount. For this reason, the upper level controller UC holds in advance a function of converting the temperature increase amounts caused by the plurality of second heaters 26c into the power amounts per predetermined time of the second outputs to be supplied to the plurality of second heaters 26c. Hereinafter, a technique for obtaining a function of converting the temperature increase amounts caused by the plurality of second heaters 26c into the power amounts per predetermined time of the second outputs to be supplied to the plurality of second heaters 26c will be described with reference to FIG. 8.

When obtaining the function, the second outputs are provided to the particular second heaters 26c, among the plurality of second heaters 26c, which have the temperature sensors TS (hereinafter, referred to as "particular temperature sensors TS") disposed at lower sides of the particular second heaters 26c. Further, in the example illustrated in FIG. 8, the number of particular second heaters 26c is three. Further, infrared energy within a particular region in the upper surface of the chuck main body 26 above the particular second heater 26c is acquired by an infrared camera IRC. Further, the number of particular regions is equal to the number of particular second heaters 26c. The measured value of the infrared energy within the particular region acquired by the infrared camera IRC is inputted to the computer PC. A measured value of a temperature from the particular temperature sensor TS is also inputted to the computer PC. Further, in the computer PC, a conversion coefficient for converting the measured value of the infrared energy into the temperature from the measured value of the temperature from the particular temperature sensor TS and the measured value of the infrared energy within the particular region from the infrared camera IRC is made.

After the conversion coefficient is made, the second output is provided to the particular second heater 26c. Further, the infrared energy within the particular region is measured by the infrared camera IRC. The measured value of the infrared energy within the particular region acquired by the infrared camera IRC is inputted to the computer PC. Further, in the computer PC, the temperature within the particular region is calculated from the measured value of the infrared energy within the particular region using the conversion coefficient. This process is repeated while changing the power amount per predetermined time of the second output by changing the aforementioned second duty ratio. Further, based on a relationship between the temperature increase amount obtained from the calculated temperature of the particular region and the power amount per predetermined time of the provided second output, a function of converting the temperature increase amount into the power amount per predetermined time of the second output is obtained in respect to each of the particular second heaters 26c.

The upper level controller UC specifies the power amount per predetermined time of the second output corresponding to the target temperature increase amount using the obtained corresponding function, thereby determining the target value of the power amount per predetermined time of the second output supplied to each of the plurality of second heaters 26c. Further, a function obtained using any one of the second heaters 26c is used to determine the target value of the power amount per predetermined time of the second output supplied to another second heater 26c that is included in the same zone Z1 as any one second heater 26c among the particular second heaters 26c.

In the aforementioned stage 16, the number of first heaters 26b is smaller than the number of second heaters 26c. That is, the number of first heaters 26b is comparatively small. Therefore, the number of power feeding lines for the plurality of first heaters 26b is decreased, and a rated electric current of each of the power feeding lines is increased. For this reason, a settable electric power range of the first outputs to be supplied to the plurality of first heaters 26b is widened, and a settable temperature range is widened. In addition, each of the comparatively plurality of second heaters 26c may be derived by the second output having comparatively low electric power. Therefore, the plurality of second heaters 26c may precisely control the in-plane temperature distribution of the substrate W even though each of the plurality of second heaters 26c has a narrow settable temperature range. Since the stage 16 has the plurality of first heaters 26b and the plurality of second heaters 26c, a temperature range settable by the stage 16 is wide, and the stage 16 may precisely control the in-plane temperature distribution of the substrate W.

In one exemplary embodiment, the plurality of first heaters 26b are provided coaxially with respect to the central axis AX. The plurality of second heaters 26c are provided in the plurality of zones Z2, respectively. The plurality of zones Z2 are provided in the central zone which intersects the central axis AX and the plurality of zones which surround the central zone and are arranged in the circumferential direction within the plurality of regions coaxial with the central axis AX. According to this exemplary embodiment, the temperature distribution in the radial direction of the substrate W is controlled by the plurality of first heaters 26b, and the temperature distribution in the radial direction and the circumferential direction of the substrate W are controlled by the plurality of second heaters 26c.

According to one exemplary embodiment, the plurality of second heaters 26c are provided closer to the upper surface of the chuck main body 26, that is, the surface on which the substrate W is placed than the plurality of first heaters 26b are to the upper surface of the chuck main body 26. Therefore, it is possible to further improve controllability of the in-plane temperature distribution of the substrate W.

In one exemplary embodiment, the plurality of first power feeding lines 73, the first heater controller 71, the plurality of second power feeding lines 74, and the second heater controller 72 are disposed in the accommodation space 18s. According to this exemplary embodiment, since the output is distributed to the plurality of first heaters 26b in the accommodation space 18s surrounded by the transmission path for the high-frequency waves, the number of filters, which are required to inhibit an inflow of the high-frequency waves to the first power source 80 from the stage 16, may be reduced. In addition, since the output is distributed to the plurality of second heaters 26c in the accommodation space 18s, the number of filters, which required to inhibit an inflow of the high-frequency waves to the second power source 82 from the stage 16, may be reduced. Therefore, deterioration in impedance properties of the filter is inhibited, and a loss of the high-frequency waves is inhibited.

In one exemplary embodiment, the power amounts of the plurality of first outputs for driving the plurality of first heaters 26b are adjusted by the first duty ratios, and the power amounts of the plurality of second outputs for driving the plurality of second heaters 26c are adjusted by the second duty ratios. According to this exemplary embodiment, it is possible to adjust the power amounts of the plurality of second outputs for driving the plurality of second heaters 26c without mounting a plurality of power control circuits (e.g., DC/DC converters) in the second heater controller 72.

In one exemplary embodiment, the plurality of second outputs to be supplied to the plurality of second heaters 26c are controlled based on the product of the measured value of electric power and the second duty ratio or based on the moving average value, instead of based on the measured values of the temperatures of the zones Z2 in which the plurality of second heaters 26c are disposed. Therefore, the number of temperature sensors to be provided in the stage 16 is reduced.

In one exemplary embodiment, the plurality of terminals 26e and the plurality of terminals 26f are provided within the outer circumferential region 260b instead of the substrate mounting region 260a. Therefore, influences of the plurality of terminals 26e and the plurality of terminals 26f on the control of the temperature of the substrate W are inhibited.

While the various exemplary embodiments have been described above, various modified aspects may be made without being limited to the aforementioned exemplary embodiments. The plasma processing apparatus having any of the stages according to the aforementioned various exemplary embodiments may be any plasma processing apparatus such as an inductively coupled plasma processing apparatus or a plasma processing apparatus for creating plasma using surface waves such as microwaves.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A stage for a plasma processing apparatus, comprising:
a power feeder that provides a transmission path configured to transmit high-frequency waves from a high-frequency power source; and
an electrostatic chuck including a conductive base provided above the power feeder, and electrically connected to the power feeder, and a chuck main body provided on the base and configured to hold a substrate with electrostatic attractive force,
wherein the chuck main body has
a plurality of first heaters provided in the chuck main body to be distributed on a plane in the chuck main body which is orthogonal to a central axis of the chuck main body, and
a plurality of second heaters provided in the chuck main body to be distributed on a separate plane in the chuck main body which is orthogonal to a central axis of the chuck main body, the number of second heaters being larger than the number of first heaters, and
wherein the stage further includes:
a first heater controller configured to drive the plurality of first heaters by an alternating current output or a direct current output from a first power source, and
a second heater controller configured to drive the plurality of second heaters by an alternating current output or a direct current output from a second power source.

2. The stage of claim 1, wherein the first heater controller is configured to drive the plurality of first heaters by the alternating current of the alternating current output from the first power source, and
the second heater controller is configured to drive the plurality of second heaters by the direct current of the direct current output from the second power source.

3. The stage of claim 1, wherein the plurality of second heaters are respectively provided in a central zone which intersects the central axis of the chuck main body and a plurality of zones which surround the central zone and are arranged in the circumferential direction within a plurality of regions coaxial with respect to the central axis of the chuck main body.

4. The stage of claim 1, wherein the chuck main body has a rear surface which is a surface facing the base, and an upper surface which is a surface opposite to the rear surface, and
the plurality of second heaters are provided between the plurality of first heaters and the upper surface, with the plurality of second heaters at a vertically higher position than the plurality of first heaters.

5. The stage of claim 1, wherein the first heater controller and the second heater controller are configured to provide a power level of electric power of the alternating current output or the direct current output from the second power source which is lower than a power level of electric power from the first power source.

6. The stage of claim 1, wherein the chuck main body is a ceramic main body, and wherein the plurality of first heaters and the plurality of second heaters are both positioned in the ceramic main body.

7. The stage of claim 6, wherein the plurality of second heaters are positioned at a vertically higher position than the plurality of first heaters.

8. The stage of claim 1, wherein an accommodation space is defined within the power feeder and between the power feeder and the base, and wherein the first and second heater controllers are positioned inside the accommodation space.

9. The stage of claim 8, wherein the chuck main body includes a ceramic main body having a rear surface with a plurality of first terminals provided at the rear surface, the plurality of first terminals connected to the plurality of first heaters, and wherein a plurality of second terminals are provided at the rear surface which are connected to the plurality of second heaters, and
   the plurality of first heaters and the plurality of second heaters are both positioned in the ceramic main body.

10. The stage according to claim 9, further including a plurality of first power feed lines extending from the accommodation space to the plurality of first terminals and a plurality of second power feed lines extending from the accommodation space to the plurality of second terminals.

11. The stage according to claim 8, further including:
   a plurality of first power feed lines coupled to the first heater controller and which provide power to the plurality of first heaters, at least part of each of the plurality of first power feed lines positioned in the accommodation space; and
   a plurality of second power feed lines coupled to the second heater controller and which provide power to the plurality of second heaters, at least part of each of the plurality of second power feed lines positioned in the accommodation space.

12. The stage according to claim 1, wherein the power feeder is electrically connected to the base and is configured to supply high-frequency power from the high-frequency power source to the base, and the base is an electrode of the stage.

13. The stage according to claim 1, wherein the chuck main body includes a substrate mounting region on which the substrate is disposed, and an outer peripheral region surrounding the substrate mounting region from an outside in a radial direction with respect to the central axis of the chuck main body and on which a focus ring is disposed,
   the outer peripheral region has an upper surface extending in a vicinity of a rear surface of the chuck main body compared to an upper surface of the substrate mounting region.

14. A stage for a plasma processing apparatus, comprising:
   a power feeder that provides a transmission path configured to transmit high-frequency waves from a high-frequency power source; and
   an electrostatic chuck including a conductive base provided above the power feeder, and electrically connected to the power feeder, and a chuck main body provided on the base and configured to hold a substrate with electrostatic attractive force,
   wherein the chuck main body has:
      a plurality of first heaters provided in the chuck main body to be distributed on a plane in the chuck main body which is orthogonal to a central axis of the chuck main body, and
   a plurality of second heaters provided in the chuck main body to be distributed on a separate plane in the chuck main body which is orthogonal to a central axis of the chuck main body, the number of second heaters being larger than the number of first heaters, and
   wherein the stage further includes:
   a first heater controller configured to drive the plurality of first heaters by an alternating current output or a direct current output from a first power source, and
   a second heater controller configured to drive the plurality of second heaters by an alternating current output or a direct current output from a second power source;
   the stage further includes a plurality of first power feeding lines electrically connected to the plurality of first heaters, respectively; and
   a plurality of second power feeding lines electrically connected to the plurality of second heaters, respectively,
   wherein the first heater controller is configured to produce a plurality of first outputs by distributing the output from the first power source and to supply the plurality of first outputs, which have individually adjusted power amounts, to the plurality of first heaters through the plurality of first power feeding lines, respectively,
   wherein the second heater controller is configured to produce a plurality of second outputs by distributing the output of the second power source and to supply the plurality of second outputs, which have individually adjusted power amounts, to the plurality of second heaters through the plurality of second power feeding lines, respectively,
   wherein the power feeder defines an accommodation space surrounded by the transmission path, and
   wherein the plurality of first power feeding lines, the first heater controller, the plurality of second power feeding lines, and the second heater controller are disposed in the accommodation space.

15. The stage of claim 14, wherein the plurality of first outputs have substantially the same and constant electric power, and the first heater controller is configured to control a plurality of first duty ratios which are ratios of supply durations for which the plurality of first outputs are supplied to the plurality of first heaters, respectively, relative to a predetermined duration, and
   wherein the plurality of second outputs have substantially the same and constant electric power, and the second heater controller is configured to control a plurality of second duty ratios which are ratios of supply durations for which the plurality of second outputs are supplied to the plurality of second heaters, respectively, relative to a predetermined duration.

16. The stage of claim 15, further comprising:
   a plurality of temperature sensors provided to respectively measure temperatures of the plurality of zones in which the plurality of first heaters are disposed,
   wherein the first heater controller is configured to adjust the plurality of first duty ratios so as to reduce an error between a target temperature and a measured value of a temperature measured by each of the plurality of temperature sensors or to reduce an error between the target temperature and a moving average value obtained from time-series data of the measured value of the temperature measured by each of the plurality of temperature sensors, and the second heater controller is configured to adjust the plurality of second duty ratios so as to reduce an error between a target value and the product of the measured value of electric power of each of the plurality of second outputs and the corresponding second duty ratio among the plurality of second duty ratios or to reduce an error between the target value and a moving average value obtained from time-series data of the product of the measured value of electric power of each of the plurality of second outputs and the corresponding second duty ratio.

17. The stage of claim 14, wherein the chuck main body has a substrate mounting region in which the substrate is placed, and an outer circumferential region which surrounds the substrate mounting region from the outside in the radial direction with respect to the central axis, and a plurality of terminals, which are electrically connected to the plurality of first power feeding lines and the plurality of second power feeding lines, are provided within the outer circumferential region.

18. The stage of claim 17, wherein the plurality of terminals are distributed around the entire circumference of the outer circumferential region.

19. The stage of claim 17, wherein the plurality of second heaters are provided within the substrate mounting region, and some of the plurality of first heaters are provided at least within the outer circumferential region.

20. A plasma processing apparatus comprising:
a chamber configured for plasma processing;
a stage as recited in claim 1 in which at least the electrostatic chuck is provided in the chamber; and
a high-frequency power source electrically connected to the power feeder.

21. The plasma processing apparatus of claim 20, further comprising:

a plurality of first power feeding lines electrically connected to the plurality of first heaters, respectively; and a plurality of second power feeding lines electrically connected to the plurality of second heaters, respectively, wherein the first heater controller is configured to produce a plurality of first outputs by distributing the output from the first power source and to supply the plurality of first outputs, which have individually adjusted power amounts, to the plurality of first heaters through the plurality of first power feeding lines, respectively, wherein the second heater controller is configured to produce a plurality of second outputs by distributing the output of the second power source and to supply the plurality of second outputs, which have individually adjusted power amounts, to the plurality of second heaters through the plurality of second power feeding lines, respectively, wherein the power feeder defines an accommodation space surrounded by the transmission path, and wherein the plurality of first power feeding lines, the first heater controller, the plurality of second power feeding lines, and the second heater controller are disposed in the accommodation space.

22. The plasma processing apparatus of claim 21, further comprising:

a first filter configured to inhibit an inflow of high-frequency waves to the first power source, partially constituting a power feeding line between the first power source and the first heater controller and provided outside the power feeder with respect to the accommodation space; and a second filter configured to inhibit an inflow of high-frequency waves to the second power source, partially constituting a power feeding line between the second power source and the second heater controller and provided outside the power feeder with respect to the accommodation space.

* * * * *